United States Patent
Hollis (10) Patent No.: US 11,699,477 B2
(45) Date of Patent: Jul. 11, 2023

(54) APPARATUSES AND METHODS FOR MULTI-LEVEL SIGNALING WITH COMMAND OVER DATA FUNCTIONALITY

(71) Applicant: MICRON TECHNOLOGY, INC., Boise, ID (US)

(72) Inventor: Timothy M. Hollis, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/499,025

(22) Filed: Oct. 12, 2021

(65) Prior Publication Data

US 2023/0116891 A1 Apr. 13, 2023

(51) Int. Cl.
| | |
|---|---|
| *G11C 11/406* | (2006.01) |
| *G11C 29/42* | (2006.01) |
| *G11C 7/10* | (2006.01) |

(52) U.S. Cl.
CPC ........ *G11C 11/40615* (2013.01); *G11C 7/109* (2013.01); *G11C 7/1048* (2013.01); *G11C 7/1063* (2013.01); *G11C 11/40622* (2013.01); *G11C 29/42* (2013.01)

(58) Field of Classification Search
CPC ..... G11C 7/1048; G11C 7/1063; G11C 7/109; G11C 11/40615; G11C 11/40622; G11C 29/42
USPC ........................................... 365/222
See application file for complete search history.

(56) References Cited

U.S. PATENT DOCUMENTS

| | | | |
|---|---|---|---|
| 6,324,602 B1* | 11/2001 | Chen | H03M 7/30 710/68 |
| 10,043,557 B1* | 8/2018 | Hollis | G11C 8/10 |
| 10,365,833 B2* | 7/2019 | Hollis | G06F 13/4282 |
| 11,038,724 B2* | 6/2021 | Lin | G11C 29/50008 |

* cited by examiner

*Primary Examiner* — Son L Mai
(74) *Attorney, Agent, or Firm* — Dorsey & Whitney LLP (57) ABSTRACT

A semiconductor device may implement a command-over-data function on a multi-level signaling data bus architectures. The multi-level signaling data bus architecture may support a multi-level communication architecture that includes a plurality of channels each including conversion of M bitstreams to N multi-level signals, where M is greater than N. A bitstream includes a plurality of bits provided serially, with each bit of the bitstream provided over a period of time. The multi-level signaling data bus is adapted to transmit data using a first set of assigned states of the data bus, and to transmit commands using at least a second assigned state of the data bus.

31 Claims, 8 Drawing Sheets

| | Pair A | Pair B | Pair C | Pair D |
|---|---|---|---|---|
| All Low - No Action | LL | LL | LL | LL |
| | | | | |
| All High - Action | HH | HH | HH | HH |
| | | | | |
| One-hot Encoding 4 Combinations | HH | LL | LL | LL |
| | LL | HH | LL | LL |
| | LL | LL | HH | LL |
| | LL | LL | LL | HH |
| | | | | |
| 1st High Remaining 3b Paired-encoding 8 Combinations | HH | LL | LL | LL |
| | HH | LL | LL | HH |
| | HH | LL | HH | LL |
| | HH | LL | HH | HH |
| | HH | HH | LL | LL |
| | HH | HH | LL | HH |
| | HH | HH | HH | LL |
| | HH | HH | HH | HH |
| | | | | |
| 1st High Remaining 6b Encoding 64 Combinations | HH | LL | LL | LL |
| | HH | LL | LL | LH |
| | HH | LL | LL | HL |
| | HH | LL | LL | HH |
| | ○ | ○ | ○ | |
| | HH | HH | HH | HL |
| | HH | HH | HH | HH |

APPARATUSES AND METHODS FOR MULTI-LEVEL SIGNALING WITH COMMAND OVER DATA FUNCTIONALITY

BACKGROUND

The pursuit of making computing systems more powerful and more power efficient has led to advancement in interface communications to improve throughput without increasing, and ideally reducing, energy consumption. Often, as clock speeds increase, a desire to increase data transition times on interface busses to match the faster clock speeds exists. Future double data rate (DDR) dynamic random-access memory (DRAM) performance targets will soon exceed DRAM transistor switching capabilities. Some systems have implemented data encoding and special purpose, multi-level (e.g., more than two levels) bus architectures to increase throughput over an interface bus. However, these special purpose architectures may increase cost and complexity, may require additional input/output (I/O) pins, and may be limited to data transmission over the data bus.

DETAILED DESCRIPTION

Certain details are set forth below to provide a sufficient understanding of embodiments of the disclosure. However, it will be clear to one having skill in the art that embodiments of the disclosure may be practiced without these particular details. Moreover, the particular embodiments of the present disclosure described herein are provided by way of example and should not be used to limit the scope of the disclosure to these particular embodiments.

Examples described herein relate to command-over-data implementations over multi-level signaling data bus architectures. For example, some input/output (I/O) bus architectures may support a multi-level communication architecture that includes a plurality of channels. In some embodiments, each channel may be single-ended and may include a single signal line. In other embodiments, each channel may include more than one signal line. For example, an I/O bus may support a channel that includes conversion of M bitstreams to N multi-level signals, where M is greater than N. A bitstream includes a plurality of bits provided serially, with each bit of the bitstream provided over a period of time. The N multi-level signals may be transmitted over the I/O bus. In one example, 3 bit streams may be converted to 2 tri-level signals. In another example, pulse-amplitude modulation (PAM) may be used to convert 2, 3, or 4 bitstreams into a single multi-level signal having (e.g., 4, 8, 16, etc., levels). Normally, these bitstreams may be used to communicate data between devices. However, in some examples, the bitstreams may also be implemented to communicate certain commands over the I/O bus by taking advantage of un-assigned states to encode various commands, such as pin-less data masking, peak current reduction, power reduction, faster bus turn-around via proximate on-die termination (ODT) controls, loopback functions, error handling, refresh operations, or any combination thereof. Using the un-assigned states of a multi-level signal over an I/O bus may enhance capabilities of a semiconductor device without having to solely rely on commands being routed through a command bus.

Figure 1:
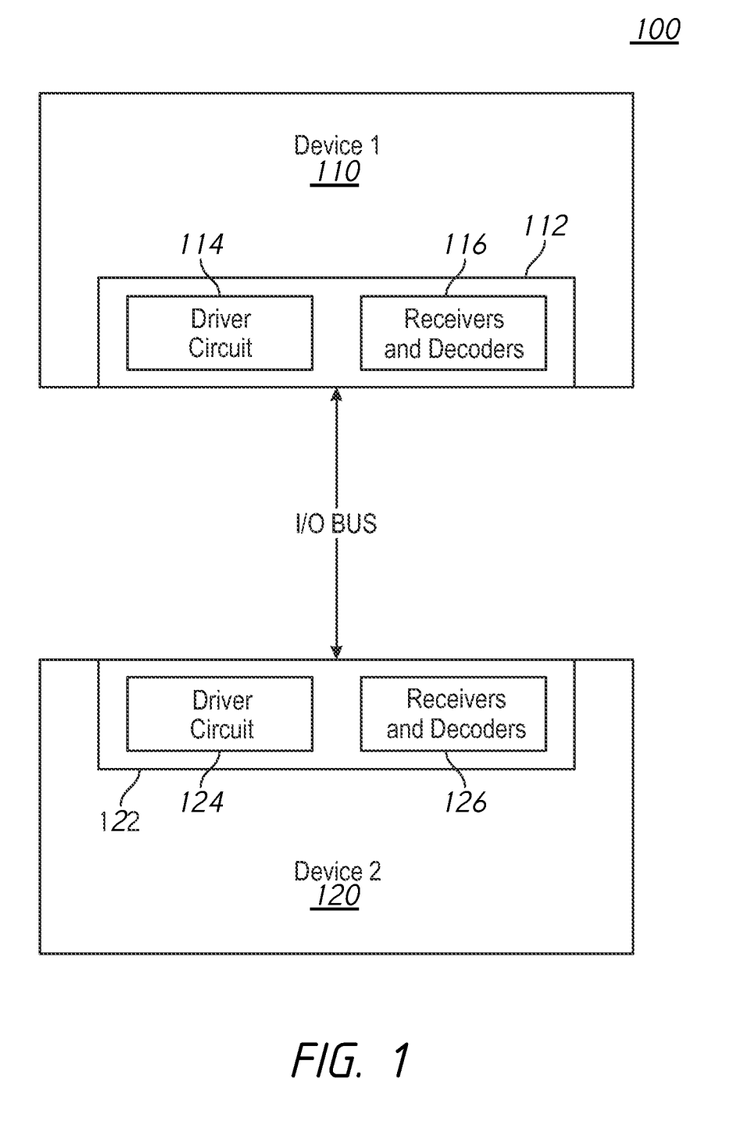
FIG. 1 is a block diagram of an apparatus according to an embodiment of the present disclosure.

FIG. 1 is a block diagram of an apparatus 100 according to an embodiment of the present disclosure. The apparatus 100 may include a first device 110 that communicates with a second device 120 over an input/output (I/O) bus. The first device 110 may include an I/O interface circuit 112 that includes driver circuit 114 and receiver and decoder circuit 116 for communication over the I/O bus. The second device 120 may include an I/O interface circuit 122 that includes driver circuit 124 and receiver and decoder circuit 126 for communication over the I/O bus. The I/O bus may support a multi-level communication architecture that includes a plurality of channels. In some embodiments, each channel may be single-ended and may include a single signal line. In other embodiments, each channel may include more than one signal line. In one embodiment, the first device 110, the second device 120, and the I/O bus may support a channel that includes conversion of M bitstreams to N multi-level signals, where M is greater than N. A bitstream includes a plurality of bits provided serially, wherein each bit of the bitstream is provided over a period of time. For example, a first bit is provided for a first period, and a second bit is provided for a second period following the first period, and a third bit is provided for a third period following the second period, and so on. The successive bits provided in this serial manner represent a stream of bits. The N multi-level signals may be transmitted over the I/O bus. In one example, 3 bit streams may be converted to 2 tri-level signals. In another example, pulse-amplitude modulation (PAM) may be used to convert 2, 3, or 4 bitstreams into a single multi-level signal having (e.g., 4, 8, 16, etc., levels). In some examples, the first device 110 may include a memory controller or processing system and/or the second device 120 may include a memory, including volatile memory and/or non-volatile memory. In some examples, the second device 120 may include a dynamic random access memory (DRAM), such as a double-data-rate (DDR) DRAM or a low power DDR DRAM. It should be noted, however, that a memory is not a necessary component of the disclosure. Rather, the disclosure may be applied to any two or more devices, on or off-chip, that communicate with one another using multi-level signaling.

The driver circuit 114 may include circuitry that applies a bitstream conversion to a set of M bitstreams to generate N multi-level signals and drives the N multi-level signals as channels on the I/O bus. Similarly, the driver circuit 124 may include circuitry that applies a bitstream conversion to a set of M bitstreams to generate N multi-level signals and drives the N multi-level signals as channels on the I/O bus. In some examples, the driver circuit 114 may include modifications to existing DDR drivers to drive the multi-level signals onto the channels of the I/O bus.

For each channel, the receiver and decoder circuit 116 may include decoders configured to recover the set of M bitstreams by decoding the N multi-level signals received via the channels of the I/O bus as provided by the driver circuit 124. Further, the receiver and decoder circuit 126 may include decoders configured to recover the set of M bitstreams by decoding the N multi-level signals received via the channels of the I/O bus as provided by the driver circuit 114. In some embodiments, the receiver and decoder circuit 116 and the receiver and decoder circuit 126 may include comparators and decoding logic to recover the set of M bitstreams.

In operation, the first device 110 and the second device 120 may communicate over the I/O bus to transfer information, such as data, addresses, commands, etc. While the I/O bus is shown to be bidirectional, the I/O bus may also be a unidirectional bus. The I/O interface circuit 112 and I/O interface circuit 122 may implement a multi-level communication architecture. In a multi-level communication architecture, a symbol is sent over a channel during a symbol period. A symbol may be a single value on a signal line of a channel, or may be a combination of values provided on a plurality of signal lines of a channel. The symbol may represent a channel state. A receiver may determine an output signal value based on the value transmitted on the signal line(s) of a channel. In a single-ended architecture, the signal line value may be compared against one or more reference values to determine the output signal value. A receiver has a time period to determine and latch the output signal value from the time the output signal transitions to the current value to the time the output signal transitions to the next value. The transition time may be determined based on a clock signal, as well as a setup and hold time based on a transition from one value to another. In a multi-level communication architecture with a fixed slew rate or fixed rise/fall times, inherent jitter may occur due to differing magnitude shifts (e.g., from VH to VL vs. from VMID to VH or VL. The amount of jitter may be based on the slew rate, the rise/fall times, the multi-level magnitudes values, or combinations thereof. In some examples, the transition times may also be affected by process, voltage, and temperature variations.

In an example, the driver circuit 114 may generate a symbol for a channel by converting a bit from each of M bitstreams into N multi-level signals. The symbol may be transmitted to the receiver and decoder circuit 126 via N signal lines of the I/O bus. The receiver and decoder circuit 126 may detect levels on the N signal lines and decode the levels to retrieve the bit from each of the M streams. By using multi-level signal lines, more data can be transmitted during a symbol period as compared with using binary signal line levels. In an example, M is 3 and N is 2, and the signal lines of the I/O bus are capable of being driven to three independent levels. In another example, M is 2 and N is 1, and the signal lines of the I/O bus are capable of being driven to four independent levels (e.g., in a PAM implementation). Communication protocol between the driver circuit 124 and the receiver and decoder circuit 116 may be similar to the communication protocol between the encoder and driver circuit 114 and the receiver and decoder circuit 126. The driver circuit 114 may include a DRAM driver that has been segmented to drive multiple (e.g., more than 2) voltage levels on a signal line.

In some examples, certain signal lines on the I/O bus may be dedicated for data bitstream transmission between the first device 110 and the second device 120. However, in some examples, the driver circuits 114 and 124 and the receivers and decoders 116 and 126 may each be adapted to communicate certain special action commands over the signal lines dedicated to the data bitstream transmission by taking advantage of un-assigned transmission states to encode the special action command(s), such as pin-less data masking, peak current reduction, power reduction, faster bus turn-around via proximate on-die termination (ODT) controls, loopback functions, error handling, refresh operations, or any combination thereof. Using the un-assigned states of a multi-level signal over an I/O bus may enhance capabilities of a semiconductor device without having to solely rely on commands being routed through a command bus.

Figure 2:
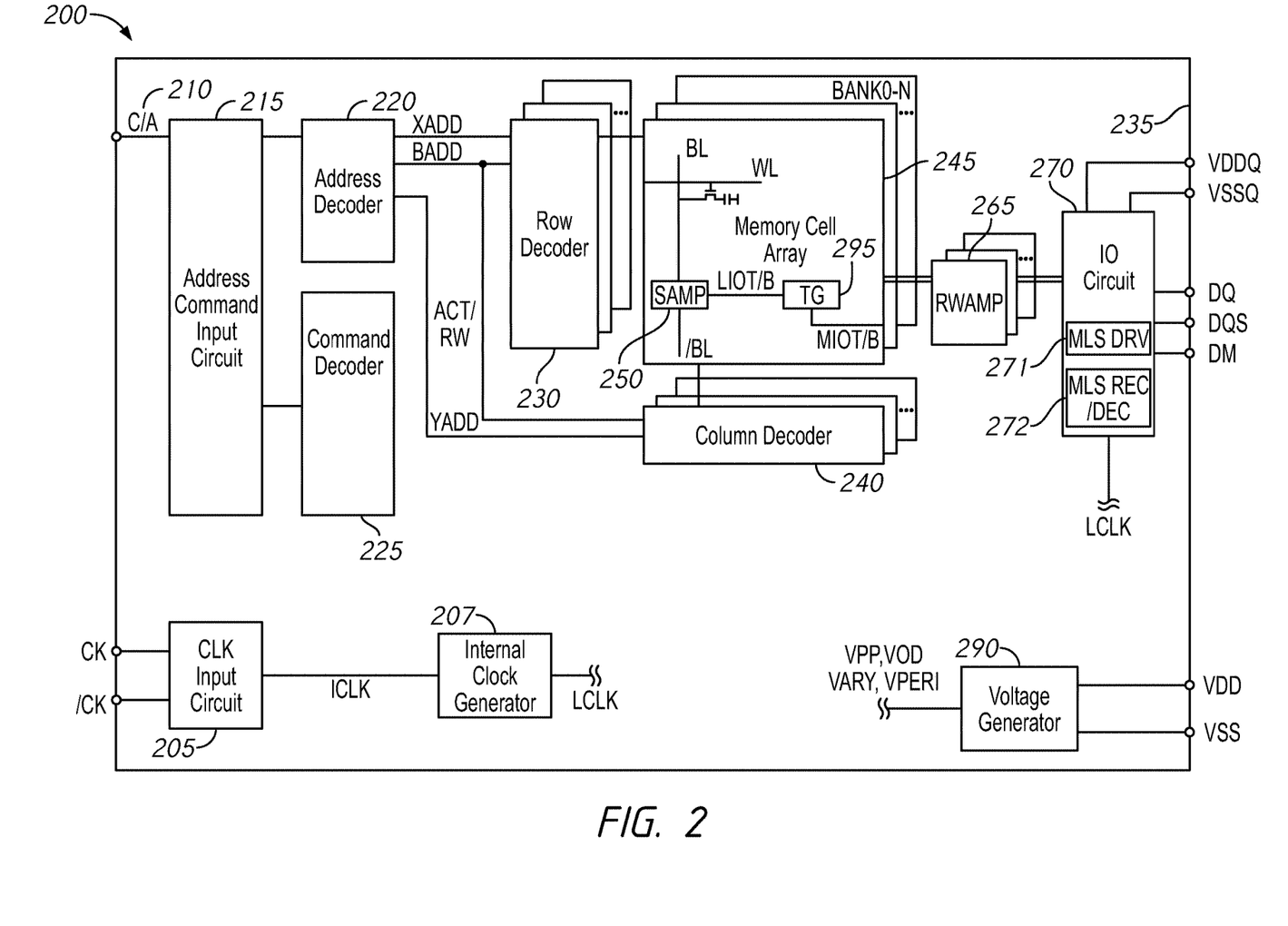
FIG. 2 is a schematic block diagram of a semiconductor device 200, in accordance with an embodiment of the present disclosure.

FIG. 2 is a schematic block diagram of a semiconductor device 200, in accordance with an embodiment of the present disclosure. For example, the semiconductor device 200 may include a chip 235. The chip 235 may include a clock input circuit 205, an internal clock generator 207, an address command input circuit 215, an address decoder 220, a command decoder 225, a control circuit 221, a cold data detector circuit 222, a plurality of row decoders 230, a memory cell array 245 including sense amplifiers 250 and transfer gates 295, a plurality of column decoders 240, a plurality of read/write amplifiers 265, an input/output (I/O) circuit 270, a cold data readout circuit 271, and a voltage generator 290. The semiconductor device 200 may include a plurality of external terminals including address and command terminals coupled to command/address bus 210, clock terminals CK and/CK, data terminals DQ, DQS, and DM, and power supply terminals VDD, VSS, VDDQ, and VSSQ. The chip 235 may be mounted on a substrate, for example, a memory module substrate, a mother board or the like.

The memory cell array 245 includes a plurality of banks BANK0-N, each bank BANK0-N including a plurality of word lines WL, a plurality of bit lines BL, and a plurality of memory cells MC arranged at intersections of the plurality of word lines WL and the plurality of bit lines BL. The number of banks BANK0-N may include 2, 4, 8, 16, or any other number of banks. Each of the banks BANK0-N may divided into two or more memory planes (e.g., column planes), which may be selected by the column select CS signal from the column decoders 240. In some examples, each of the banks BANK0-N may include 2, 4, 8, 16, 32, etc., column planes. The selection of the word line WL for each bank is performed by a corresponding row decoder 230 and the selection of the bit line BL is performed by a corresponding column decoder 240. The plurality of sense amplifiers 250 are located for their corresponding bit lines BL and coupled to at least one respective local I/O line further coupled to a respective one of at least two main I/O line pairs, via transfer gates TG 295, which function as switches.

The address/command input circuit 215 may receive an address signal and a bank address signal from outside at the command/address terminals via the command/address bus 210 and transmit the address signal and the bank address signal to the address decoder 220. The address decoder 220 may decode the address signal received from the address/command input circuit 215 and provide a row address signal XADD to the row decoder 230, and a column address signal YADD to the column decoder 240. The address decoder 220 may also receive the bank address signal and provide the bank address signal BADD to the row decoder 230 and the column decoder 240.

The address/command input circuit 215 may receive a command signal from outside, such as, for example, a memory controller 205 at the command/address terminals via the command/address bus 210 and provide the command signal to the command decoder 225. The command decoder 225 may decode the command signal and provide generate various internal command signals. For example, the internal command signals may include a row command signal to select a word line, a column command signal, such as a read command or a write command, to select a bit line, and/or a low latency enable bit to enable use of the control circuit control circuit 221 and/or the low latency register cold data detector circuit 222.

When a read command is issued and a row address and a column address are timely supplied with the activation and read commands (ACT/RW), read data is read from a memory cell in the memory cell array 245 designated by the row address and the column address. The read/write amplifiers 265 may receive the read data DQ and provide the read data DQ to the IO circuit 270. The IO circuit 270 may provide the read data DQ to outside via the data terminals DQ, together with a data strobe signal at DQS and/or a data mask signal at DM. The IO circuit 270 may include multi-level signal drivers 271 that are configured to encode and drive multi-level voltages on signal lines on the output data bus to the data terminals DQ. The multi-level signal drivers 271 may include the output encoder and driver circuit 114 and/or the output encoder and driver circuit 124 of FIG. 1.

Similarly, when the write command is issued and a row address and a column address are timely supplied with the ACT and write commands R/W, and then the IO circuit 270 may receive write data at the data terminals DQ, together with a data strobe signal at DQS and/or a data mask signal at DM and provide the write data via the read/write amplifiers 265 to the memory cell array 245. Thus, the write data may be written in the memory cell designated by the row address and the column address. To receive and decode the write data, the IO circuit 270 may include multi-level signal receivers 272 that are configured to receive and decode multi-level voltages on signal lines on the input data bus. The multi-level signal receivers 272 may include the receiver and decoder circuit 116 and/or the receiver and decoder circuit 126 of FIG. 1.

However, in some examples, multi-level signal drivers 271 and the multi-level signal receivers 272 of the I/O circuit 270 may be configured to communicate (e.g., transmit and/or receive, respectively) certain special action commands over the DQ terminals by taking advantage of un-assigned signal line encoding states to encode various special action command(s), such as pin-less data masking, peak current reduction, power reduction, faster bus turn-around via proximate on-die termination (ODT) controls, loopback functions, error handling, refresh operations, or any combination thereof. Using the un-assigned states of a multi-level signal over the DQ data terminals may enhance capabilities of a semiconductor device without having to solely rely on commands being routed through a command and address bus 210.

Turning to the explanation of the external terminals included in the semiconductor device 200, the clock terminals CK and/CK may receive an external clock signal and a complementary external clock signal, respectively. The external clock signals (including complementary external clock signal) may be supplied to a clock input circuit 205. The clock input circuit 205 may receive the external clock signals and generate an internal clock signal ICLK. The clock input circuit 205 may provide the internal clock signal ICLK to an internal clock generator 207. The internal clock generator 207 may generate a phase controlled internal clock signal LCLK based on the received internal clock signal ICLK and a clock enable signal CKE from the address/command input circuit 215. Although not limited thereto, a DLL circuit may be used as the internal clock generator 207. The internal clock generator 207 may provide the phase controlled internal clock signal LCLK to the IO circuit 270. The IO circuit 270 may use the phase controller internal clock signal LCLK as a timing signal for determining an output timing of read data.

The power supply terminals may receive power supply voltages VDD and VSS. These power supply voltages VDD and VSS may be supplied to a voltage generator circuit 290. The voltage generator circuit 290 may generate various internal voltages, VPP, VOD, VARY, VPERI, and the like based on the power supply voltages VDD and VSS. The internal voltage VPP is mainly used in the row decoder 230, the internal voltages VOD and VARY are mainly used in the sense amplifiers 250 included in the memory cell array 245, and the internal voltage VPERI is used in many other circuit blocks. The power supply terminals may also receive power supply voltages VDDQ and VSSQ. The IO circuit 270 may receive the power supply voltages VDDQ and VSSQ. For example, the power supply voltages VDDQ and VSSQ may be the same voltages as the power supply voltages VDD and VSS, respectively. However, the dedicated power supply voltages VDDQ and VSSQ may be used for the IO circuit 270.

Figure 3:
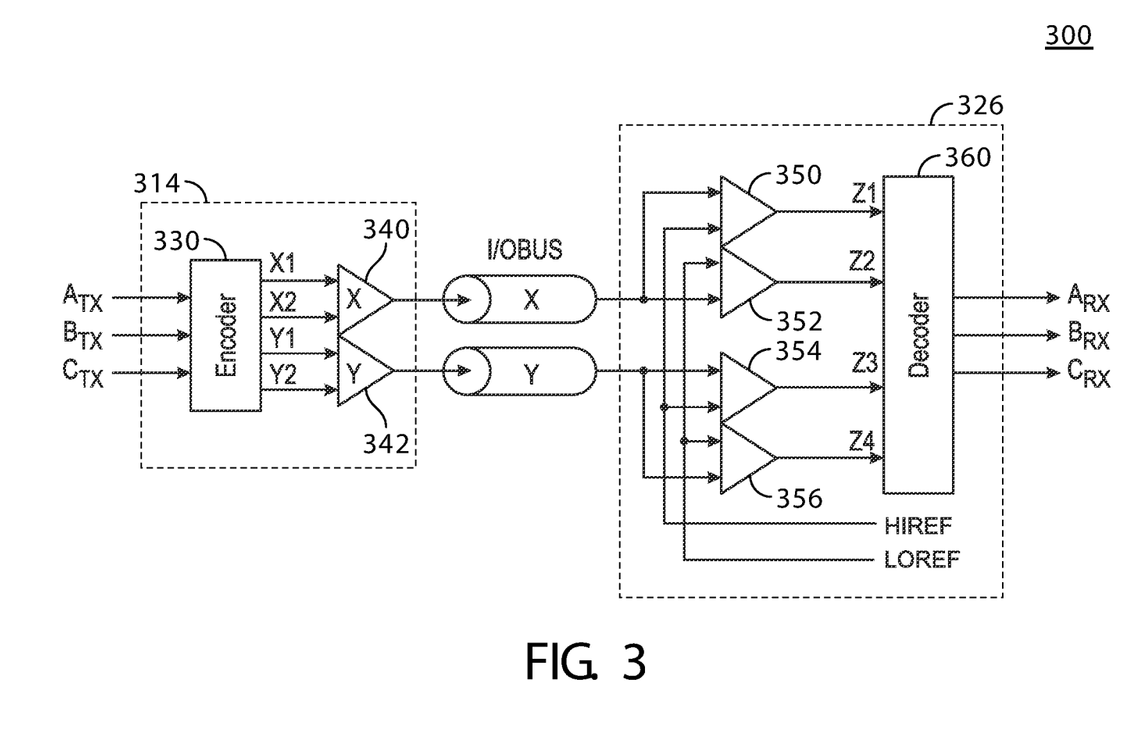
FIG. 3 is a block diagram of an apparatus 300 for a multi-level communication architecture including a pair of signal lines according to an embodiment of the present disclosure.

FIG. 3 is a block diagram of an apparatus 300 for a multi-level communication architecture including a pair of signal lines according to an embodiment of the present disclosure. The apparatus 300 may include a signal driver 314 coupled to a receiver 326 via an I/O bus. The signal driver 314 may be implemented in the driver circuit 114 and/or the driver circuit 124 of FIG. 1 and the receiver 326 may be implemented in the receiver and decoder circuit 116 and/or the receiver and decoder circuit 126 of FIG. 1.

The signal driver 314 may include an encoder 330 coupled to a driver 340 and a driver 342. The encoder 330 may be configured to receive bitstreams ATX, BTX, and CTX. The encoder 330 may encode the ATX, BTX, and CTX to provide X1, X2, Y1, and Y2 control signals. The driver 340 may receive the X1 and X2 control signals and may drive a voltage on an X signal line of the I/O bus based on the X1 and X2 control signals. The driver 342 may receive the Y1 and Y2 control signals and may drive a voltage on a Y signal line of the I/O bus based on the Y1 and Y2 control signals. Thus, the signal driver 314 may convert ATX, BTX, and CTX bitstreams into two multi-level signals to be driven over the I/O bus.

The receiver 326 may include comparators 350, 352, 354, and 356 coupled to a decoder 360. The comparators 350 and 352 may be configured to receive the signal from the X signal line of the I/O bus and the comparators 354 and 356 may be configured to receive the signal from the Y signal line of the I/O bus. The comparator 350 may compare the signal of the X signal line to a high reference signal HIREF to provide a Z1 signal to the decoder 360. The comparator 352 may compare the signal of the X signal line to a low reference signal LOREF to provide a Z2 signal to the decoder 360. The comparator 354 may compare the signal of the Y signal line to the HIREF signal to provide a Z3 signal to the decoder 360. The comparator 354 may compare the signal of the Y signal line to the LOREF signal to provide a Z4 signal to the decoder 360. The decoder 360 may include logic to generate ARX, BRX, and CRX bitstreams based on the Z1, Z2, Z3, and Z4 signals from the comparators 350, 352, 354, and 356, respectively. The ARX, BRX, and CRX signals may be logical equivalents of data transmitted by the ATX, BTX, and CTX signals.

In operation, the ATX, BTX, and CTX signals may be three bitstreams to be transmitted over the I/O bus. Rather than send each bitstream on a separate signal line, the signal driver 314 may encode the ATX, BTX, and CTX signals to be transmitted over two signal lines using multi-level signals. For example, the encoder 330 may receive the ATX, BTX, and CTX signals, and during each symbol period, may encode a symbol in the form of the X1, X2, Y1, and Y2 control signals to control the drivers to drive the pair of signal lines of the I/O bus to respective voltages. While the embodiment illustrated in FIG. 3 is provided the three bitstreams ATX, BTX, and CTX, which are merged through encoding, in other embodiments one bit stream may be provided and three sequential bits may be provided as three bits of data for encoding. For example, every third bit of data from the bitstream may be provided as a first bit of data, every third bit of data of a following bit may be provided as a second bit of data, and every third bit of a yet another following bit may be provided as a third bit of data to provide three bits of data for encoding from one bitstream.

The encoder 330 may include control logic to provide each of the X1, X2, Y1, and Y2 control signals. The driver 340 may drive a voltage on the X signal line of the I/O bus responsive to the X1 and X2 control signals. The driver 342 may drive a voltage on the Y signal line of the I/O bus responsive to the Y1 and Y2 control signals. The voltages driven by the driver 340 and driver 342 may be one of three levels.

The comparators 350 and 352 may receive the voltage from the X signal line, and the comparators 354 and 356 may receive the voltage from the Y signal line. The comparator 350 may provide the Z1 signal based on the comparison between the voltage of the X signal line with the REFHI voltage. The comparator 352 may provide the Z2 signal based on the comparison between the voltage of the X signal line with the REFLO voltage. The comparator 354 may provide the Z3 signal based on the comparison between the voltage of the Y signal line with the REFHI voltage. The comparator 356 may provide the Z4 signal based on the comparison between the voltage of the X signal line with the REFHI voltage. The decoder 360 may include decoding logic to generate ARX, BRX, and CRX signals based on the Z1, Z2, Z3, and Z4 signals.

The ARX, BRX, and CRX signals may be provided to downstream circuitry for processing, such as being processed as data to be stored at a memory or as data that has been retrieved from a memory. However, in some examples, the ARX, BRX, and CRX may also be configured to communicate certain commands over the DQ terminals by taking advantage of un-assigned states to encode various commands, such as pin-less data masking, peak current reduction, power reduction, faster bus turn-around via proximate on-die termination (ODT) controls, loopback functions, error handling, refresh operations, or any combination thereof. Using the un-assigned states of a multi-level signal over the DQ data terminals may enhance capabilities of a semiconductor device without having to solely rely on commands being routed through a command and address bus.

While FIG. 3 depicts an apparatus 300 that encodes three bitstreams to be transmitted over two multi-level signal lines of an I/O bus, the apparatus 300 may be altered to include additional or less bitstreams, more or less than two signal lines, and an ability to drive more than three voltage levels on each signal line.

Figure 4:
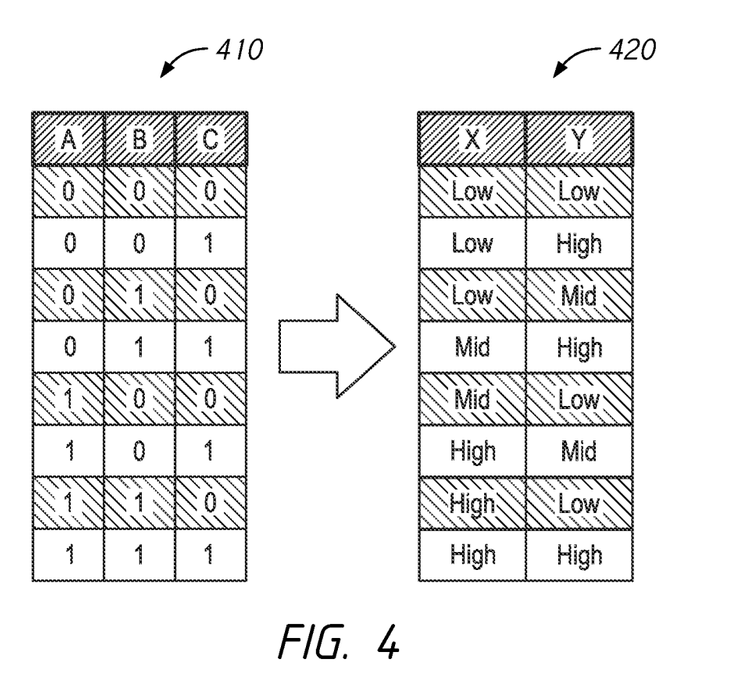
FIG. 4 is an encoding map 400 for encoding three bitstreams on two signal lines that are configured to be driven using a multi-level communication architecture according to an embodiment of the present disclosure.

FIG. 4 is an encoding map 400 for encoding three bitstreams on two signal lines that are configured to be driven using a multi-level communication architecture according to an embodiment of the present disclosure. The encoding map 400 may be used by the encoder 330 of FIG. 2 to encode the ATX, BTX, and CTX bitstreams to multi-level signals to be driven over the X and Y signal lines of the I/O bus via the driver 340 and the driver 342, respectively. The encoding map 400 includes a first table 410 including possible logical combinations of A, B, and C signals and a second table 420 that includes exemplary unique multi-level encoding of X and Y signal lines for each logical combination of the A, B, and C signal. For example, when the A, B, and C bitstreams each have a logical value of zero (e.g., line 1 of the first table 410), the X and Y signals may be driven to a low voltage. In another example, if the A bitstream has a logical value of zero and the B and C bitstreams have a logical value of one, the X signal may be driven to a middle voltage and Y signal may be driven to a high voltage. It will be appreciated that different mapping may be implemented to encode the A, B, and C signals on the X and Y signals, so long as each unique logical combination of the A, B, and C signals maps to a unique voltage combination on the X and Y signals. For example, the A, B, and C bitstreams having logical values of zero may map to the X and Y signals having high voltages, rather than low voltages, and the A, B, and C bitstreams having logical values of one may map to the X and Y signals having low voltages, rather than high voltages.

In some examples, certain state combinations of the A, B, and C signals may be provided to downstream circuitry for processing, such as being processed as data to be stored at a memory or as data that has been retrieved from a memory. However, in some examples, the A, B, and C may also be configured to communicate certain commands over the data bus by taking advantage of un-assigned data states to encode various commands. Examples of commands to be encoded may include pin-less data masking, peak current reduction, power reduction, faster bus turn-around via proximate on-die termination (ODT) controls, loopback functions, error handling, refresh operations, or any combination thereof. Using the un-assigned states of a multi-level signal over the DQ data terminals may enhance capabilities of a semiconductor device without having to solely rely on commands being routed through a command and address bus.

Figure 5:
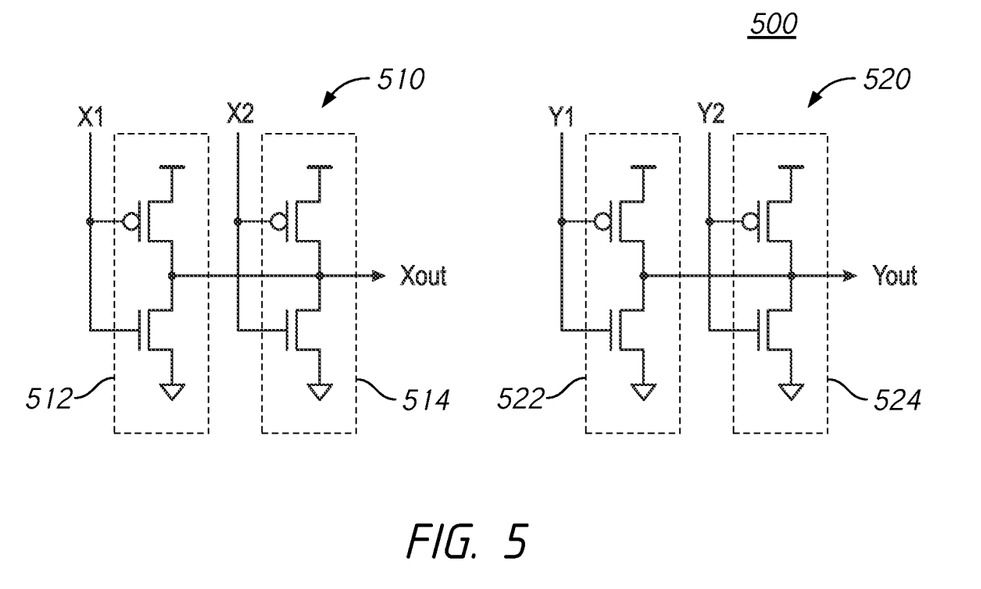
FIG. 5 is a schematic diagram of drivers 500 for a multi-level communication architecture according to an embodiment of the present disclosure.

FIG. 5 is a schematic diagram of drivers 500 for a multi-level communication architecture according to an embodiment of the present disclosure. The drivers 500 may include an X signal line driver 510 configured to drive an XOUT signal to an X signal line based on X1 and X2 control signals and a Y signal line driver 520 configured to drive the YOUT signal to a Y signal line based on Y1 and Y2 control signals. The X signal line driver 510 may be implemented in the 114 and/or the 124 of FIG. 1 and/or the driver 340 of FIG. 3. The Y signal line driver 520 may be implemented in the 114 and/or the 124 of FIG. 1 and/or the driver 342 of FIG. 3.

The X signal line driver 510 may include an X1 signal line driver 512 and an X2 signal line driver 514 coupled in parallel between a high supply voltage and a low supply voltage. The X1 signal line driver 512 may be configured to drive a voltage on the XOUT signal responsive to the X1 control signal. For example, the X1 signal line driver 512 may drive the XOUT signal to a high voltage responsive via a pull up (e.g., p-type) transistor responsive to the X1 control signal having a low logical value and may drive the XOUT signal to a low voltage via a pull down (e.g., n-type) transistor responsive to the X1 control signal having a high logical value. Likewise, the X2 signal line driver 514 may be configured to drive the voltage on the XOUT signal responsive to the X2 control signal. For example, the X2 signal line driver 514 may drive the XOUT signal to a high voltage via a pull up transistor responsive to the X2 control signal having a low logical value and may drive the XOUT signal to a low voltage via the pull down transistor responsive to the X2 control signal having a high logical value. The combination of the X1 signal line driver 512 and the X2 signal line driver 514 may drive the XOUT signal to three logical voltage values, e.g., low, mid and high. For example, when both the X1 signal line driver 512 and the X2 signal line driver 514 are driving the XOUT to a high voltage, the XOUT signal may have a high voltage. When both the X1 signal line driver 512 and the X2 signal line driver 514 are driving the XOUT to a low voltage, the XOUT signal may have a low voltage. When one of the X1 signal line driver 512 or the X2 signal line driver 514 are driving the XOUT to a high voltage and the other of the X1 signal line driver 512 or the X2 signal line driver 514 are driving the XOUT to a low voltage, the XOUT signal may have a mid voltage level.

The Y signal line driver 520 may include a Y1 signal line driver 522 and a Y2 signal line driver 524 coupled in parallel between the high supply voltage and the low supply voltage. The Y1 signal line driver 522 may be configured to drive a voltage on the YOUT signal responsive to the Y1 control signal. For example, the Y1 signal line driver 522 may drive the YOUT signal to a high voltage via a pull up transistor responsive to the Y1 control signal having a low logical value and may drive the YOUT signal to a low voltage via a pull down transistor responsive to the Y1 control signal having a high logical value. Likewise, the Y2 signal line driver 524 may be configured to drive the voltage on the YOUT signal responsive to the Y2 control signal. For example, the Y2 signal line driver 524 may drive the YOUT signal to a high voltage via a pull up transistor responsive to the Y2 control signal having a low logical value and may drive the YOUT signal to a low voltage via a pull down transistor responsive to the Y2 control signal having a high logical value. Similar to operation of the X signal line driver 510, the combination of the Y1 signal line driver 522 and the Y2 signal line driver 524 may drive the YOUT signal to three logical voltage values, e.g., low, mid and high.

In operation, the X signal line driver 510 and the Y signal line driver 520 may drive one of three voltages to the XOUT and YOUT signals, respectively. The X signal line driver 510 may drive the XOUT signal responsive to the X1 and X2 control signals, and the Y signal line driver 520 may drive the YOUT signal responsive to the Y1 and Y2 control signals. In an example, when the X1 control signal has a low logical value, the pull up transistor of the X1 signal line driver 512 is enabled to couple the high supply voltage to the XOUT signal and pull down transistor is disabled. When the X1 control signal has a high logical value, the pull up transistor of the X1 signal line driver 512 is disabled and the pull down transistor is enabled to couple the low supply voltage to the XOUT signal. Operation of the X2 signal line driver 514, the Y1 signal line driver 522, and the Y2 signal line driver 524 responsive to the X2, Y1, and Y2 control signals, respectively, may be similar to the X1 signal line driver 512 responsive to the X1 control signal. The XOUT signal may be a combination of the voltages driven by the X1 signal line driver 512 and the X2 signal line driver 514. The YOUT signal may be a combination of the voltages driven by the Y1 signal line driver 522 and the Y2 signal line driver 524. The XOUT and YOUT signals may have a high voltage VH, a low voltage VL, or a middle voltage VMID between the high supply and low supply voltages. The middle voltage may be achieved when the X1 signal line driver 512 (or the Y1 signal line driver 522) and the X2 signal line driver 514 (or the Y2 signal line driver 524) are driving different voltages (e.g., one driving the high supply voltage and the other driving the low supply voltage).

Figure 6:
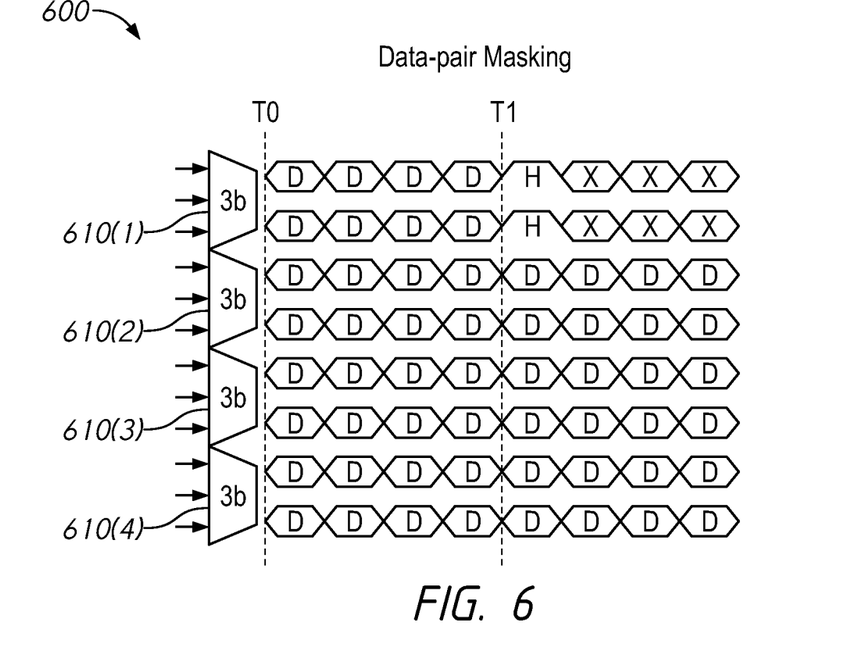
FIG. 6 is an exemplary timing diagram 600 depicting a data-pair masking command over a data bus using a multi-level communication architecture according to an embodiment of the present disclosure.

FIG. 6 is an exemplary timing diagram 600 depicting a data-pair masking command over a data bus using a multi-level communication architecture according to an embodiment of the present disclosure. As shown in FIG. 6, each of four driver circuits 610(1)-(4) may drive three respective bits over two respective signal lines. In some examples, the driver circuits 610(1)-(4) may be implemented in the driver circuits 114 and/or 124 of FIG. 1, the multi-level signal driver circuit 271 of FIG. 2, the driver circuit 314 of FIG. 3, the drivers 500 of FIG. 5, or any combination thereof. The signals depicted in the timing diagram 600 may be consumed by one or more receiver circuits (e.g., such as the receiver circuits 116 and/or 126 of FIG. 1, the multi-level signal receiver circuit 272 of FIG. 2, the receiver circuit 316 of FIG. 3, or any combination thereof.

As shown in the timing diagram 600, during a first transmission burst from time T0 to T1 (e.g., first transmission burst period), each of the four driver circuits 610(1)-(4) may serially transmit a respective first set of data. The respective first set of data may include four individual 3-bit data sets serially transmitted over two respective signal lines data. In some examples, the 3-bit data sets may be encoded over the two signal lines based on the table 400 of FIG. 4.

Starting at time T1, a second transmission burst (e.g., start of a second transmission burst period) may begin for transmitting a second set of data. However, at time T1, the first driver circuit 610(1) may transmit a data-pair mask command, which may be encoded as both signals being driven to the logical high values ("H"). In response to the data-pair mask command, a receiver (e.g., the receiver circuits 116 and/or 126 of FIG. 1, the multi-level signal receiver circuit 272 of FIG. 2, the receiver circuit 316 of FIG. 3, or any combination thereof) may mask any data received over the first pair of signal lines corresponding to the first driver circuit 610(1). In some examples, in response to the data pair mask command, receivers may mask data received over the first pair of signal lines of the data bus during and/or subsequent to the second transmission burst. In other examples, in response to the data-pair mask command, receivers may mask data received over the first pair of signal lines of the data bus during the first transmission burst. Each of the three remaining driver circuits 610(2)-(4) may serially transmit a respective second set of data, which would be decoded by the receiver circuit.

In some examples, the data-pair mask command may be set up such that is has to be enabled or activated for every transmission burst. In other examples, one enabled, the data-pair mask command may remain enabled until a second data-pair mask command is received from the respective driver circuit 610(1)-(4). The timing diagram 600 is exemplary. The data-pair mask command could be implemented in different multi-level communications architectures without departing from the scope of the disclosure. In some examples, a transmission burst may include serial transmission of more or fewer than four data sets and/or a data bus may include more or fewer than 8 signal lines (e.g., and corresponding driver circuits) without departing from the scope of the disclosure. Lastly, the data-pair mask command may be implemented using a different, unassigned code associated with the data bus without departing from the scope of the disclosure.

While FIG. 6 depicts the data-pair mask command being transmitted during an initial time period of the second transmission burst period, it is appreciated that the data-pair mask command may be transmitted at an end time period of the second transmission burst period or at a middle time period of the second transmission burst period without departing from the scope of the disclosure. If the data-pair mask command is received during the end time period of the second transmission burst period, the data bits received over the first pair of signal lines prior to the data-pair mask during the second transmission burst period may be masked. If the data-pair mask command is received during the middle time period of the second transmission burst period, the data bits received over the first pair of signal lines prior to and subsequent to the data-pair mask command during the second transmission burst period may be masked.

Figure 7:
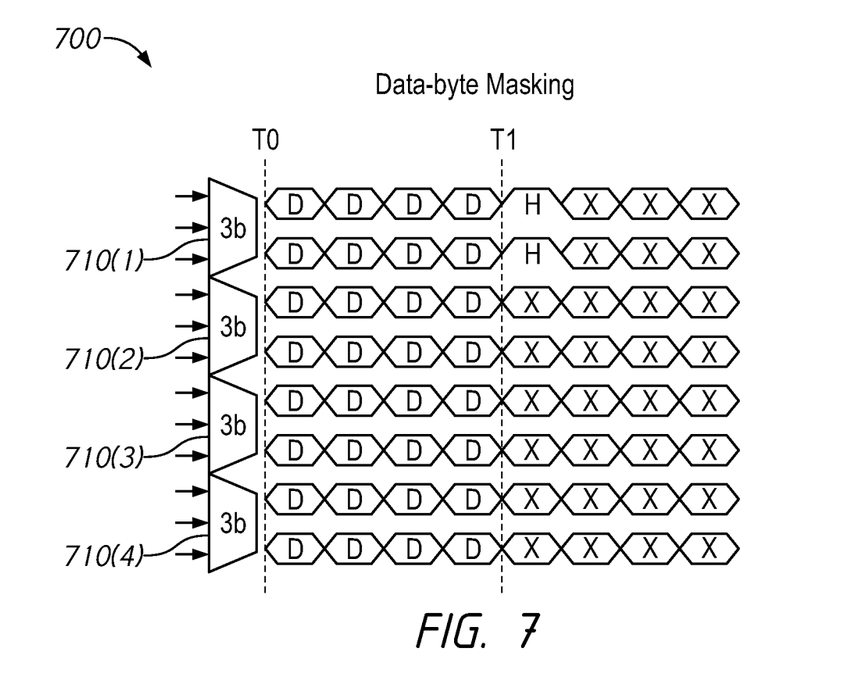
FIG. 7 is an exemplary timing diagram 700 depicting a data-byte masking command over a data bus using a multi-level communication architecture according to an embodiment of the present disclosure.

FIG. 7 is an exemplary timing diagram 700 depicting a data-byte masking command over a data bus using a multi-level communication architecture according to an embodiment of the present disclosure. As shown in FIG. 7, each of four driver circuits 710(1)-(4) may drive three respective bits over two respective signal lines. In some examples, the driver circuits 710(1)-(4) may be implemented in the driver circuits 114 and/or 124 of FIG. 1, the multi-level signal driver circuit 271 of FIG. 2, the driver circuit 314 of FIG. 3, the drivers 500 of FIG. 5, or any combination thereof. The signals depicted in the timing diagram 700 may be consumed by one or more receiver circuits (e.g., such as the receiver circuits 116 and/or 126 of FIG. 1, the multi-level signal receiver circuit 272 of FIG. 2, the receiver circuit 316 of FIG. 3, or any combination thereof.

As shown in the timing diagram 700, during a first transmission burst from time T0 to T1, each of the four driver circuits 710(1)-(4) may serially transmit a respective first set of data. The respective first set of data may include four individual 3-bit data sets serially transmitted over two respective signal lines data. In some examples, the 3-bit data sets may be encoded over the two signal lines based on the table 400 of FIG. 4.

Starting at time T1, a second transmission burst may begin for transmitting a second set of data. However, at time T1, the first driver circuit 610(1) may transmit a data-byte mask command, which may be encoded as both signals being driven to the logical high values ("H"). In response to the data-byte mask command, receivers (e.g., the receiver circuits 116 and/or 126 of FIG. 1, the multi-level signal receiver circuit 272 of FIG. 2, the receiver circuit 316 of FIG. 3, or any combination thereof) may mask data received over all signal lines of the data bus (e.g., including data transmitted by all of the driver circuits 710(1)-(4)). In some examples, in response to the data-byte mask command, receivers may mask data received over the signal lines of the data bus during and/or subsequent to the second transmission burst. In other examples, in response to the data-byte mask command, receivers may mask data received over the signal lines of the data bus during the first transmission burst.

In some examples, the data-byte mask command may be set up such that is has to be enabled or activated for every transmission burst. In other examples, one enabled, the data-byte mask command may remain enabled until a second data-byte mask command is received from the respective driver circuit 710(1)-(4). In some examples, the data-byte mask command may be transmitted by a designated one of the driver circuits 710(1)-(4). In other examples, the data-byte mask command may be transmitted by any or all of the driver circuits 710(1)-(4).

The timing diagram 700 is exemplary. The data-byte mask command could be implemented in different multi-level communications architectures without departing from the scope of the disclosure. In some examples, a transmission burst may include more or fewer than four data sets and/or a data bus may include more or fewer than 8 signal lines (e.g., and corresponding driver circuits) without departing from the scope of the disclosure. Lastly, the data-pair mask command may be implemented using a different, unassigned code associated with the data bus without departing from the scope of the disclosure.

While FIG. 7 depicts the data-byte mask command being transmitted during an initial time period of the second transmission burst period, it is appreciated that the data-byte mask command may be transmitted at an end time period of the second transmission burst period, or at a middle time period of the second transmission burst period without departing from the scope of the disclosure. If the data-byte mask command is received during the end time period of the second transmission burst period, the data bits received over all of the signal lines prior to the data-byte mask command during the second transmission burst period may be masked. If the data-byte mask command is received during the middle time period of the second transmission burst period, the data bits received over all of the signal lines prior to and subsequent to the data-byte mask command during the second transmission burst period may be masked.

Figure 8A:
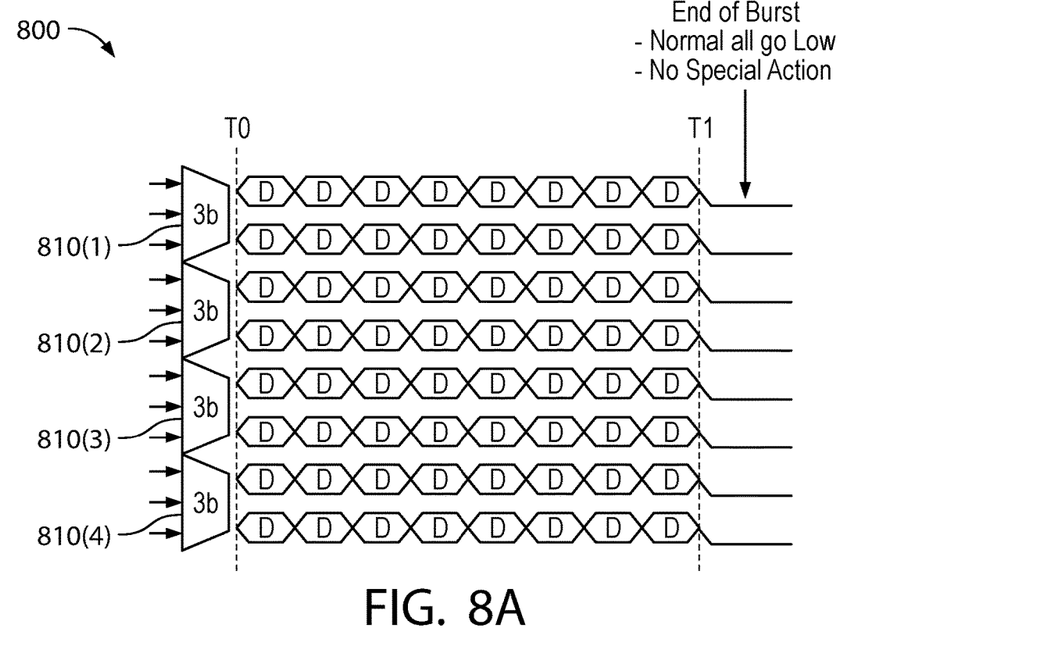
FIGS. 8A-8C depict an exemplary command-over-data bus architecture according to an embodiment of the present disclosure.
Figure 8B:
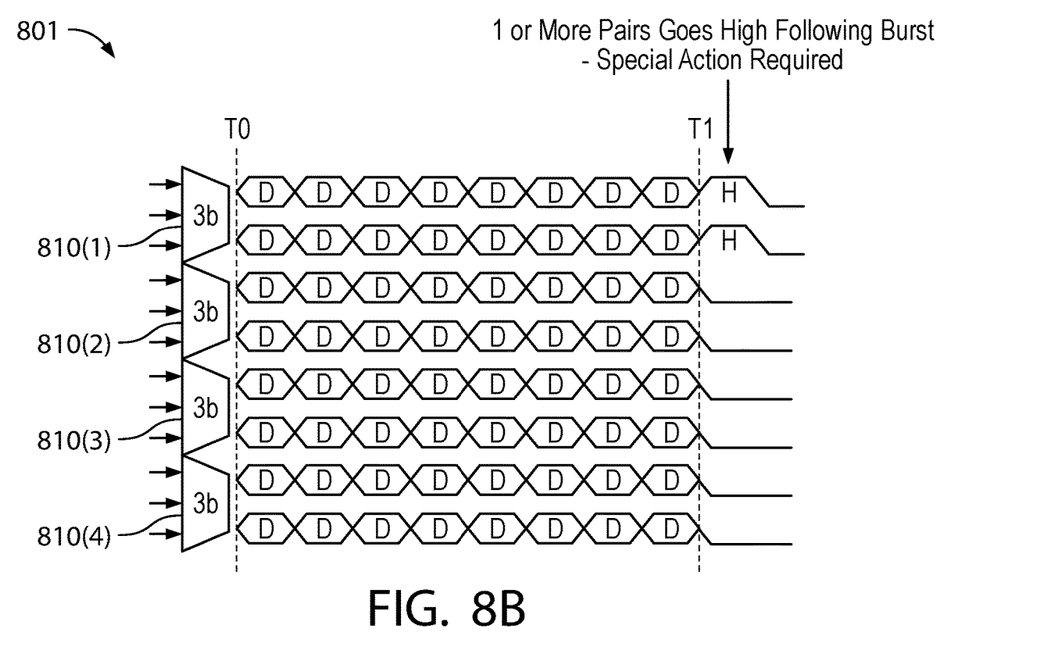
Figure 8C:
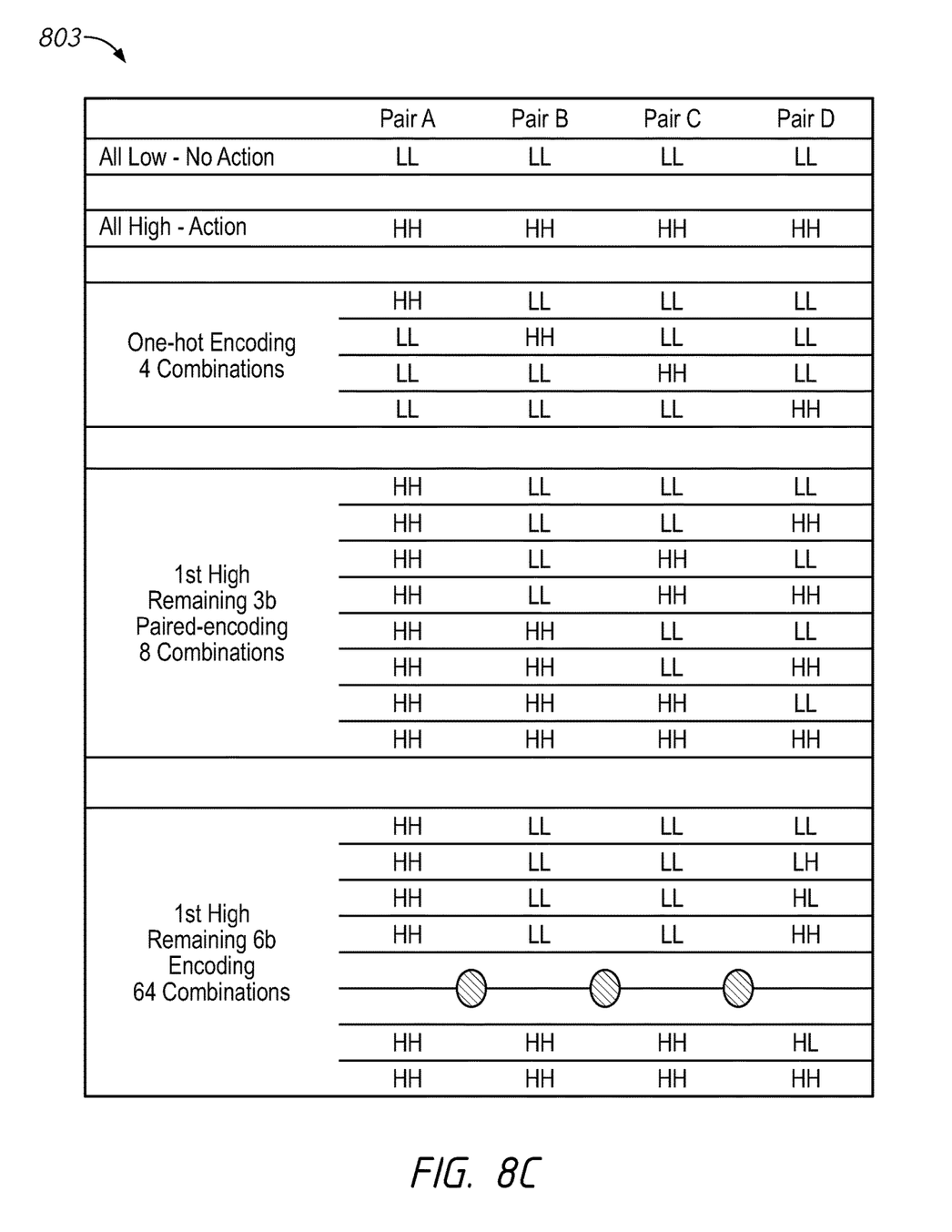

FIGS. 8A-8C depict an exemplary command-over-data bus architecture according to an embodiment of the present disclosure. FIG. 8A depicts a first timing diagram 800 with no command received over the data bus according to an embodiment of the present disclosure. FIG. 8B depicts a second timing diagram 801 with a command received over the data bus according to an embodiment of the present disclosure. As shown in FIGS. 8A and 8B, each of four driver circuits 810(1)-(4) may drive three respective bits over two respective signal lines. In some examples, the driver circuits 810(1)-(4) may be implemented in the driver circuits 114 and/or 124 of FIG. 1, the multi-level signal driver circuit 271 of FIG. 2, the driver circuit 314 of FIG. 3, the drivers 500 of FIG. 5, or any combination thereof. The signals depicted in the timing diagrams 800 and 801 may be consumed by one or more receiver circuits (e.g., such as the receiver circuits 116 and/or 126 of FIG. 1, the multi-level signal receiver circuit 272 of FIG. 2, the receiver circuit 316 of FIG. 3, or any combination thereof).

As shown in both timing diagrams 800 and 801, during a first transmission burst from time T0 to T1, each of the four driver circuits 810(1)-(4) may serially transmit a respective first set of data. The respective first set of data may include 8 individual 3-bit data sets serially transmitted over two respective signal lines data. In some examples, the 3-bit data sets may be encoded over the two signal lines based on the table 400 of FIG. 4.

With reference to FIG. 8A, at time T1, the driver circuits 810(1)-(4) may all transition the signal lines to a logical low value to indicate an end of a burst with no special action.

With reference to FIG. 8B, at time T1, one or more of the driver circuits 810(1)-(4) may transition the signal lines to a logical high value to command a special action by the receiver (e.g., the receiver circuits 116 and/or 126 of FIG. 1, the multi-level signal receiver circuit 272 of FIG. 2, the receiver circuit 316 of FIG. 3, or any combination thereof).

FIG. 8C depicts a table 803 of possible implementations of the encoding of the special action command according to an embodiment of the present disclosure. Pair A may correspond to the signal lines associated with driver circuit 810(1), Pair B may correspond to the signal lines associated with driver circuit 810(2), Pair C may correspond to the signal lines associated with driver circuit 810(3), and Pair D may correspond to the signal lines associated with driver circuit 810(4).

In a first example shown in Table 803, the driver circuits 810(1)-(4) may drive all Pair A, Pair B, Pair C, and Pair D signal lines to the low logical value (e.g., as in the timing diagram 800 of FIG. 8A) to indicate that no special action should be taken. In a second example shown in Table 803, the driver circuits 810(1)-(4) may drive all Pair A, Pair B, Pair C, and Pair D signal lines to issue a special action command. In some examples, the specific action may be predefined (e.g., such as in a mode register). In other examples, subsequent data bit sets following the special action command may provide the specific action to be taken.

In a third example shown in Table 803, each one of the driver circuits 810(1)-(4) may individually drive its respective Pair A, Pair B, Pair C, or Pair D signal lines to the logical high value to issue a different respective special action command. For example, the first driver circuit 810(1) may drive the Pair A signal lines to the logical high value to issue a first predefined special action command, the second driver circuit 810(2) may drive the Pair B signal lines to the logical high value to issue a second predefined special action command that is different than the first predefined special action command, etc. In this third example, the driver circuits 810(1)-(4) may be capable of driving four different special action commands. In some examples, the four special action commands may be mutually exclusive (e.g., only one can be set at a time. In other examples, two or more of the special action commands may be send contemporaneously.

In fourth and fifth examples shown in Table 803, the first driver circuit 810(1) may drive its respective Pair A signal lines to the logical high value to activate a special action command (e.g., a special action command flag), and the remaining driver circuits 810(2)-(4) may encode the particular special action to be taken in the respective Pair B, Pair C, or Pair D signal lines. For example, in the fourth example, the remaining driver circuits 810(2)-(4) may encode the particular special action by individually driving both of the signal lines of the respective Pair B, Pair C, or Pair D signal lines to a same value (e.g., drive both signal lines to logical high values or drive both signal lines to logical low values). In this fourth example, there are 8 possible different combinations of HH or LL across the Pair B, Pair C, and Pair D signal lines, and each combination may be encode a different predefined action to be taken. Thus, in response to the Pair A signal lines being set to HH, the receiver may decode the HH and LL combinations of the Pair B, Pair C, and Pair D signal lines to determine the particular action to be taken.

The fifth example is similar to the fourth example, except that the remaining driver circuits 810(2)-(4) are not limited to driving only HH or LL on the respective Pair B, Pair C, and Pair D signal lines. Instead, the remaining driver circuits 810(2)-(4) may individually drive any H or L combination the respective Pair B, Pair C, and Pair D signal lines. In this fifth example, there are 64 possible different combinations of H and L across the six signal lines that make up the Pair B, Pair C, and Pair D signal lines, and each combination may be encode a different predefined action to be taken. Thus, in response to the Pair A signal lines being set to HH, the receiver may decode the H and L combinations of the Pair B, Pair C, and Pair D signal lines to determine the particular action to be taken.

In some examples, the data-pair mask command may be set up such that it has to be enabled or activated for every transmission burst. In other examples, once enabled, the data-pair mask command may remain enabled until a second data-pair mask command is received from the respective driver circuit 610(1)-(4). The timing diagram 600 is exemplary. The data-pair mask command could be implemented in different multi-level communications architectures without departing from the scope of the disclosure. In some examples, a transmission burst may include serial transmission of more or fewer than four data sets and/or a data bus may include more or fewer than 8 signal lines (e.g., and corresponding driver circuits) without departing from the scope of the disclosure. Lastly, the data-pair mask command may be implemented using a different, unassigned code associated with the data bus without departing from the scope of the disclosure.

In some examples, the special actions may include pinless data masking (e.g., as described with reference to FIGS. 5 and 6), peak current reduction, power reduction, faster bus turn-around via proximate on-die termination (ODT) controls, loopback functions (e.g., trigger the memory device to transmit information back to a host over the data bus in response to received data), error handling (e.g., provide an error detect code to the host), refresh operations, or any combination thereof. In one example, the special action command may cause the memory device to shut down or go into an idle mode.

In an example, rather than ODT controls flowing through the command bus based on the state (e.g., read, write, idle, etc.) of the memory device, the command-over-data bus architecture may be used to directly enable/disable and/or configure the ODT of the memory device by providing the special action command encoded with the particular ODT setting.

In one example, the command-over-data bus architecture may be implemented to stagger refresh of memories (e.g., multiple ones of the semiconductor devices 200 of FIG. 2) of a memory module during a module-level refresh. For example, using the fourth and fifth examples, a host controller could individually control when each memory or each sub-group of memories of the memory module started a refresh by providing the module refresh command over the command bus, and in parallel over the data bus, providing the special action command encoded with an identifier assigned to a particular memory of the memory module. This example would reduce peak current consumption by staggering when each memory starts a refresh operation on the memory module.

While FIGS. 8A and 8B depict the special action command being transmitted during an initial time period of the second transmission burst period, it is appreciated that the data-byte mask command may be transmitted at an end time period of the second transmission burst period, or at a middle time period of the second transmission burst period without departing from the scope of the disclosure.

Figure 9:
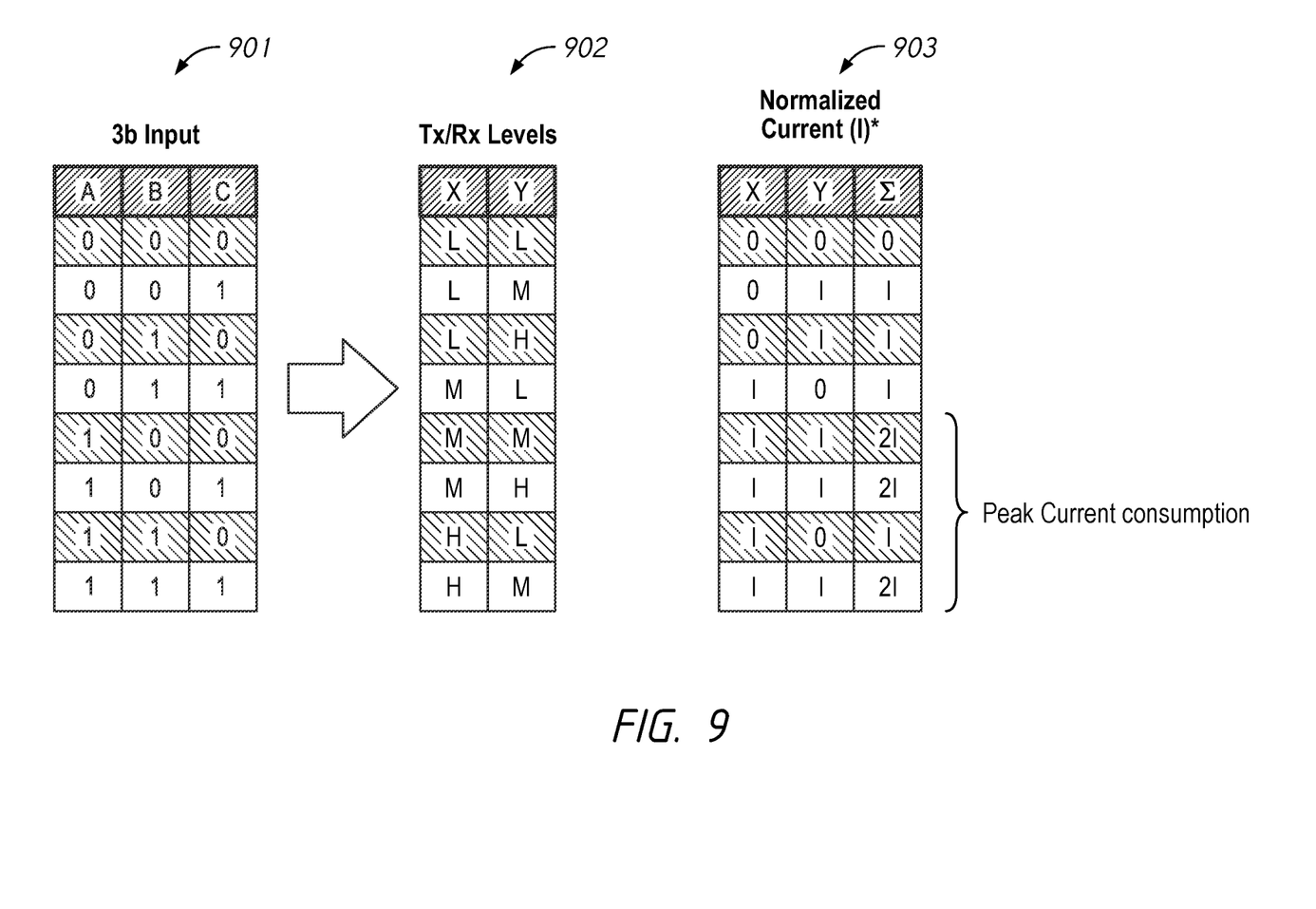
FIG. 9 depicts exemplary tables 901, 902, and 903 showing a pair of signal line currents for each encoded 3-bit value in multi-level signal data bus architecture according to an embodiment of the present disclosure.

In yet another example, the special action command may be implemented to reduce total power of signals transmitted over the data bus using a data bus inversion (e.g.,) algorithm. FIG. 9 depicts exemplary tables 901, 902, and 903 showing a pair of signal line currents for each encoded 3-bit value in multi-level signal data bus architecture according to an embodiment of the present disclosure. The multi-level signal architecture depicted in FIG. 9 is a 3 bit over two pin data bus architecture. Table 901 depicts each possible bit combination of three bits, table 902 depicts the multi-level signal line encoding (e.g., high logical value (voltage), low logical value (voltage), or middle logical value (voltage)) for the bit combinations, and table 903 depicts the amount of current consumed for the transmission. As shown in Tables 901, 902, and 902, a few particular bit combinations (e.g., b100, b101, and b11) may result in peak current consumption (e.g., 21) because cause both of the X and Y signal lines to be driven to one of the middle or the high voltage levels. Thus, a DBI algorithm could be implemented to cause those bits to be inverted in some way to reduce an amount of current, and therefore power that is consumed during the transmission. The tables 901, 902, and 903 are exemplary, and it is appreciated that different encoding may be implemented without departing from the scope of the disclosure. Also, as noted above, the command-over-data bus implementation may be applied to any multi-level data bus architecture, including 4 bits over three signal lines or pin architectures, PAM architectures, etc.

From the foregoing it will be appreciated that, although specific embodiments of the disclosure have been described herein for purposes of illustration, various modifications may be made without deviating from the spirit and scope of the disclosure. Accordingly, the disclosure is not limited except as by the appended claims.

What is claimed is:

1. An apparatus, comprising:
a driver circuit configured to, during a first time period, encode a set of data bitstreams for contemporaneous transmission to a receiving device via a set of multi-level signal lines of a data bus, wherein, during a second time period, the driver circuit is configured to encode a special action command for transmission to the receiving device via the set of multi-level signal lines of the data bus, wherein the special action command indicates an action to be performed by the receiving device, wherein a count of the set of data bitstreams is greater than the count of the set of multi-level signal lines.

2. The apparatus of claim 1, wherein the driver circuit includes a set of drivers each configured to, during the first time period, drive a respective one of the set of multi-level signal lines based on the encoded first set of data bitstreams, wherein the set of drivers are each further configured to, during the second time period, drive the respective one of the set of multi-level signal lines based on the encoded special action command.

3. The apparatus of claim 1, wherein, during the second time period, the driver circuit is configured to encode an on-die termination command for transmission to the receiving device via the set of multi-level signal lines as the special action command.

4. The apparatus of claim 1, wherein, during the second time period, the driver circuit is configured to encode, for transmission to the receiving device via the set of multi-level signal lines, a staggered refresh command including an identifier corresponding to the receiving device of a memory module that includes a plurality of other receiving devices as the special action command.

5. The apparatus of claim 4, further comprising a command driver configured to provide a module-level refresh command for transmission to the receiving device via a command bus.

6. The apparatus of claim 1, further comprising a second driver circuit configured to, during the first time period, encode a second set of data bitstreams for contemporaneous transmission to the receiving device via a second set of multi-level signal lines of the data bus, wherein, during the second time period, the second driver circuit is configured to encode a second special action command for transmission to the receiving device via the second set of multi-level signal lines of the data bus, wherein the second special action command indicates a second action to be performed by the receiving device that is different than the action indicated by the special action command.

7. The apparatus of claim 1, further comprising a second driver circuit configured to, during the first time period, encode a second set of data bitstreams for contemporaneous transmission to the receiving device via a second set of multi-level signal lines of the data bus, wherein, during the second time period, the second driver circuit is configured to encode a special action flag command for transmission to the receiving device via the second set of multi-level signal lines of the data bus, wherein the special action flag command causes the receiving device to decode the special action command.

8. The apparatus of claim 1, wherein, during the first time period, the driver circuit is configured to encode the set of data bitstreams for contemporaneous transmission to the receiving device via the set of multi-level signal lines based on a first set of assigned states for the set of multi-level signal lines, wherein, during the second time period, the driver circuit is configured to encode the special action command for transmission to the receiving device via the set of multi-level signal lines based on at least a second assigned state for the set of multi-level signal lines that is mutually exclusive of any of the first set of assigned states.

9. The apparatus of claim 1, wherein the set of data bitstreams includes at least three bitstreams and the set of multi-level signal lines includes at least two signal lines.

10. The apparatus of claim 1, wherein the special action command includes at least one of a data bus inversion command, a loopback command directing the receiving device to provide a response to the set of data bitstreams, or an error-handling command.

11. The apparatus of claim 1, wherein the first time period precedes the second time period.

12. The apparatus of claim 1, wherein the second time period precedes the first time period.

13. The apparatus of claim 1, wherein the first time period and the second time period occur during a same transmission burst period having a plurality of time periods.

14. The apparatus of claim 1, wherein the first time period occurs during a first transmission burst period having a first plurality of time periods than the second time period occurs during a second transmission burst period having a second plurality of time periods.

15. The apparatus of claim 1, wherein the second time period occurs during an initial time period of a transmission burst period having a plurality of time periods including the initial time period.

16. The apparatus of claim 1, wherein the second time period occurs during a last time period of a transmission burst period having a plurality of time periods including the last time period.

17. The apparatus of claim 1, wherein the second time period occurs after an initial time period and before a last time period of a transmission burst period having a plurality of time periods including the initial time period and the last time period.

18. An apparatus, comprising:
a receiver circuit configured to determine a state of a set of multi-level signal lines of a data bus, wherein, in response to the state of the set of multi-level signal lines of the data bus having one of a first set of assigned states, recovering a respective bit for each of a set of data bitstreams, wherein, in response to the state of the set of multi-level signal lines of the data bus having a second assigned state different than any one of the first set of assigned states, recovering a special action command and cause performance of an action indicated by the special action command, wherein a count of the set of data bitstreams is greater than the count of the set of multi-level signal lines.

19. The apparatus of claim 18, wherein the receiver circuit includes a set of receivers each configured to receiver a respective one of the set of multi-level signal lines.

20. The apparatus of claim 18, wherein the receiver circuit is configured to configure on-die termination in response to the special action command being an on-die termination command.

21. The apparatus of claim 18, wherein, during a module level refresh, the receiver circuit is configured to initiate a refresh operation in response to receipt of an identifier associated with the receiver circuit included in the special action command.

22. The apparatus of claim 21, further comprising a command decoder configured to receiver a module-level refresh command via a command bus.

23. The apparatus of claim 18, further comprising a second receiver circuit configured to determine a state of a second set of multi-level signal lines of the data bus, wherein, in response to the state of the second set of multi-level signal lines of the data bus having one of the first set of assigned states, recovering a respective bit for each of a second set of data bitstreams, wherein, in response to the state of the second set of multi-level signal lines of the data bus having a third assigned state different than any one of the first set of assigned states, recovering a second special action command different than the special action command and cause performance of a second action indicated by the second special action command.

24. The apparatus of claim 18, wherein the special action command is a special action flag command, the apparatus further comprising a second receiver circuit configured to determine a state of a second set of multi-level signal lines of the data bus, wherein, in response to the state of the set of multi-level signal lines of the data bus having the second assigned state, recovering a particular special action based on the state of the second set of multi-level signal lines and cause performance of the particular special action indicated by the state of the second set of multi-level signal lines.

25. A method, comprising:
during a first time period:
encoding, at a driver circuit of a first semiconductor device, a set of data bitstreams for contemporaneous transmission to a second semiconductor device via a set of multi-level signal lines of a data bus; and
transmitting the encoded set of data bitstreams on the set of multi-level signal lines of the data bus, wherein a count of the set of data bitstreams is greater than the count of the set of multi-level signal lines; and
during a second time period:
encoding a special action command for transmission to the second semiconductor device via the set of multi-level signal lines of the data bus, wherein the special action command indicates an action to be performed by the receiving device; and
transmitting the encoded special action command on the set of multi-level signal lines of the data bus.

26. The method of claim 25, wherein, during the second time period, encoding an on-die termination command for transmission to the second semiconductor device via the set of multi-level signal lines as the special action command.

27. The method of claim 25, wherein, during the second time period, encoding, for transmission to the receiving device via the set of multi-level signal lines, a staggered refresh command including an identifier corresponding to the second semiconductor device of a memory module that includes a plurality of other second semiconductor devices as the special action command.

28. The method of claim 27, wherein, during the second time period, providing, from the first semiconductor device a module-level refresh command to the second semiconductor device via a command bus.

29. The method of claim 25, further comprising:
during the first time period:
encoding, at a second driver circuit of the first semiconductor device, a second set of data bitstreams for contemporaneous transmission to the second semiconductor device via a second set of multi-level signal lines of the data bus; and
transmitting the encoded second set of data bitstreams on the second set of multi-level signal lines of the data bus; and
during the second time period:
encoding a second special action command for transmission to the second semiconductor device via the second set of multi-level signal lines of the data bus wherein the second special action command indicates a second action to be performed by the receiving device that is different than the action indicated by the special action command; and
transmitting the encoded second special action command on the second set of multi-level signal lines of the data bus.

30. The method of claim 25, further comprising:
during the first time period:
encoding, at a second driver circuit of the first semiconductor device, a second set of data bitstreams for contemporaneous transmission to the second semiconductor device via a second set of multi-level signal lines of the data bus; and
transmitting the encoded second set of data bitstreams on the second set of multi-level signal lines of the data bus; and
during the second time period:

encoding a special action flag command for transmission to the receiving device via the second set of multi-level signal lines of the data bus wherein the special action flag command causes the receiving device to decode the special action command; and transmitting the encoded special action command flag on the second set of multi-level signal lines of the data bus.

31. The method of claim 25, wherein the set of data bitstreams includes at least three bitstreams and the set of multi-level signal lines includes at least two signal lines.

\* \* \* \* \*